(12) United States Patent
Ahn

(10) Patent No.: US 6,746,540 B2
(45) Date of Patent: Jun. 8, 2004

(54) WAFER SUPPORT PLATE ASSEMBLY HAVING RECESSED UPPER PAD AND VACUUM PROCESSING APPARATUS COMPRISING THE SAME

(75) Inventor: Gye-Tak Ahn, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 126 days.

(21) Appl. No.: 10/087,833

(22) Filed: Mar. 5, 2002

(65) Prior Publication Data

US 2002/0124964 A1 Sep. 12, 2002

(30) Foreign Application Priority Data

Mar. 6, 2001 (KR) ........................................ 2001-11541

(51) Int. Cl.⁷ ........................... H01L 21/00; C23C 16/00
(52) U.S. Cl. .................. 118/728; 118/500; 156/345.51; 204/192.1; 204/192.32; 204/192.34; 204/298.15
(58) Field of Search ................................. 118/728, 510; 156/345.51; 204/192.1, 192.32, 192.34, 298.27, 298.15; 404/938

(56) References Cited

U.S. PATENT DOCUMENTS

| 4,732,761 A | * | 3/1988 | Machida et al. | ............ | 438/695 |
| 4,971,676 A | | 11/1990 | Doue et al. | | |
| 5,039,388 A | * | 8/1991 | Miyashita et al. | ..... | 204/192.32 |
| 6,042,653 A | * | 3/2000 | Tanaka et al. | .............. | 118/728 |
| 6,116,848 A | * | 9/2000 | Thomas et al. | ............. | 414/754 |

FOREIGN PATENT DOCUMENTS

| JP | 7-221042 | 8/1995 |
| KR | 1990-0069995 | 9/1999 |
| KR | 2000-0034535 | 6/2000 |

* cited by examiner

*Primary Examiner*—Parviz Hassanzadeh
*Assistant Examiner*—Ram N Kackar
(74) *Attorney, Agent, or Firm*—Volentine Francos PLLC

(57) ABSTRACT

A plate assembly on which a wafer is supported in the processing chamber of a processing apparatus facilitates a precise transfer of the wafer therefrom even when a vacuum atmosphere is present in the chamber. The plate assembly includes an underlying support plate and a pad dedicated to support the rear surface of the wafer. A plurality of recesses, in the form of parallel grooves, extend in the upper surface of the pad so that the rear surface of the wafer can also be exposed to the vacuum atmosphere in the processing chamber. Accordingly, a pressure difference at both sides of the wafer is minimized. Thus, the wafer can be raised off of the plate assembly while the precise position thereof is maintained.

13 Claims, 7 Drawing Sheets

WAFER SUPPORT PLATE ASSEMBLY HAVING RECESSED UPPER PAD AND VACUUM PROCESSING APPARATUS COMPRISING THE SAME

BACKGROUND OF THE INVENTION

1. Field of the Invention

The present invention relates to a plate assembly that supports a workpiece in a processing chamber while the workpiece is processed in a vacuum. More specifically, the present invention relates to apparatus for processing a semiconductor wafer in a high vacuum atmosphere, and to a plate assembly for supporting the wafer in the processing chamber of such an apparatus.

2. Description of the Related Art

Currently, due to the widespread use of computers, semiconductor memory devices are being rapidly developed to provide greater memory storage and faster operating speeds. To this end, current processing technology in the art of manufacturing semiconductor devices is focused on developing and realizing memory devices having a high degree of integration, response speed, and reliability. These technologies include thin film forming, fine pattern forming, and ion-implantation processes.

Furthermore, the conditions of pressure, temperature, and gas flow must be accurately controlled during these semiconductor device manufacturing processes. If the processing conditions are not accurately controlled, the resulting semiconductor devices may fail or produce process errors. That is, the ability to accurately control the processing conditions during the manufacturing of semiconductor devices has a direct affect on the reliability of the devices and the productivity of the manufacturing process In particular, recent semiconductor device manufacturing processes rely on the creation of a stable high vacuum condition. For example, current ion-implantation processes may be carried out in a vacuum of $1.0 \times 10^{-6}$ to $1.0 \times 10^{-7}$ Torr.

Furthermore, a semiconductor device is manufactured by repeatedly carrying out the thin film forming process, the fine pattern forming process, the ion-implantation process and the like. In the manufacturing of semiconductor device, therefore, a wafer must be accurately positioned throughout the course of its being transported and processed several times.

As can be seen from the description above, the manufacturing of a semiconductor device requires not only controlling the processing conditions (vacuum, temperature and gas flow), but also the position of the wafer, the processing order, and the like. For example, an ion-implantation process must be carried out as follows. A vacuum of $1.0 \times 10^{-6}$ Torr, for example, must be established in a processing chamber. The wafer is placed on a plate, i.e., a chuck, in the processing chamber. In particular, the wafer is set on a predetermined portion of the plate. As mentioned above, a high degree of vacuum is established in the processing chamber. Therefore, members are disposed on the plate to position the wafer as the wafer is set on the plate.

Korean Patent Laid-Open Publication No. 1999-6995, Korean Patent Laid-Open Publication No. 2000-34535, Japanese Patent Laid-Open Publication No Heya 7-221042 and U.S. Pat. No. 4,971,676 issued to Doue et al. all disclose examples of a wafer support plate having positioning members disposed thereon.

Now, an example of the way in which a wafer is set on a wafer support plate in a high vacuum atmosphere in a processing chamber will be described with reference to FIGS. 1 and 2.

FIG. 1 is a schematic diagram of an apparatus for implanting ions into a wafer W. The apparatus includes a processing chamber 10 and a plate assembly 12 disposed in the processing chamber 10. The plate assembly 12 has a pad 12a whose surface contacts the rear surface of the wafer W when the wafer W is positioned on the plate assembly 12, and a plate 12b supporting the pad 12a. The plate assembly 12 may also include a fence 20 as a stop for the wafer W, and a flange 22 that guides the wafer W during the movement of the wafer W onto the pad 12a. The fence 20 and the flange 22 extend along half the periphery of the pad 12a. The apparatus for implanting ions in the wafer W also includes a robot arm 14. The robot arm 14 is used to transport the wafer W from outside the processing chamber 10 onto the plate assembly 12 and from the plate assembly 12 to the outside of the processing chamber 10. Furthermore, the apparatus includes a lifter 18 having lifter pins 16. The lifter 18 and the lifter pins 16 support the rear surface of the wafer to position and/or lift the wafer on/from the plate assembly 12.

Referring now to FIG. 2, the wafer W is moved by the robot arm 14 onto/from the plate assembly 12. More specifically, the lifter 18 and the lifter pins 16 are raised. At this time, the robot arm 14 is positioned between the plate assembly 12 and the wafer W which is resting on the lifter pins 16. Then, the lifter 18 is lowered. Accordingly, the wafer W is placed on the robot arm 14, and is in turn transported by the robot arm 14.

At this time, the wafer W is positioned on the robot arm 14 by members (not shown) disposed on the plate assembly 12. If the wafer W is not positioned precisely on the robot arm 14, the wafer W may be damaged, for example, scratched, by the robot arm 14 In an extreme case, the mis-positioned wafer W may be dropped while being carried by the robot arm 14. Specifically, in many instances, the wafer W may not settle precisely on the robot arm 14 despite the presence of the wafer-positioning members of the plate assembly 12. The reason for this is that a pressure difference may be present or suddenly created in the space between the plate assembly 12 and the wafer W at the time the wafer W is being raised by the lifter 18 and the lifer pins 16. The pressure difference is created by a vacuum of $1.0 \times 10^{-8}$ Torr, for example, produced in the processing chamber 10.

When the surface of the wafer W is scratched or when the wafer W has fallen from the robot arm 14 for the reasons described above, the damaged wafer must be reworked or discarded. Therefore, the use of the prior art apparatus lowers the productivity of the semiconductor device manufacturing process.

SUMMARY OF THE INVENTION

An object of the present invention is to solve the above-described problem of the prior art.

More specifically, one object of the present invention to provide a plate assembly that will allow a vacuum atmosphere in a processing chamber to act on the rear surface of a workpiece supported by the plate assembly.

It is likewise another object of the present to provide an apparatus for processing a workpiece in a vacuum wherein a minimal pressure difference is produced at both sides of the workpiece while the workpiece is being supported. thereby minimizing the tendency of the workpiece to be mis-positioned when it is raised off of the support The plate assembly includes an underlying plate and a pad having a plurality of recesses in the upper surface thereof. Preferably, the recesses are parallel grooves that extend straight across the upper surface from one side thereof to the other. Furthermore, the plate assembly is generally disc-shaped and has a larger area than that of the workpiece so that the entire rear surface of the workpiece is situated on the pad.

The plate assembly is disposed in a processing chamber in which a process is carried out on the workpiece under a vacuum. The workpiece is supported on the pad of the plate assembly One or more lift pins are provided to lower the workpiece onto the plate assembly or raise the workpiece up off of the plate assembly. A robot arm can moved into position to receive the workpiece from the lifter pin(s) or transfer the workpiece to the lifter pin(s). Preferably, the robot arm has a bifurcated (Y-shaped) free end so as not to interfere with the operation of the lifter pin(s). Also, the robot arm has a working range that allows it to transfer the wafer from the vicinity of the plate assembly to the outside of the processing chamber and vice versa.

The workpiece may be a wafer used in the manufacturing of semiconductor devices. In this case, the processing apparatus may be an apparatus for forming a film on the wafer, an apparatus for forming a pattern on the wafer or an apparatus for implanting ions into the wafer.

In the processing apparatus, the wafer is placed on the plate assembly and is processed. After the workpiece is processed, the lift pin(s) is/are raised into contact with the rear surface of the workpiece to transfer the workpiece off of the pad of the plate assembly. At this time, the recesses in the upper surface of the pad of the plate assembly allow the vacuum atmosphere in the processing chamber to act at the rear surface of the workpiece. Because the pressure is significantly equalized at both sides of the wafer, the workpiece is not disturbed as it is raised by the lift pin(s). As a result, the wafer will not be scratched by the robot arm and thus, the wafer can be safely transported.

BRIEF DESCRIPTION OF THE DRAWINGS

The above and other objects and advantages of the present invention will become more apparent from the following detailed description thereof made in conjunction with the accompanying drawings, of which

DETAILED DESCRIPTION OF THE PREFERRED EMBODIMENTS

The preferred embodiments of the present invention will be explained in detail hereinafter with reference to the attached drawings.

Figure 1:
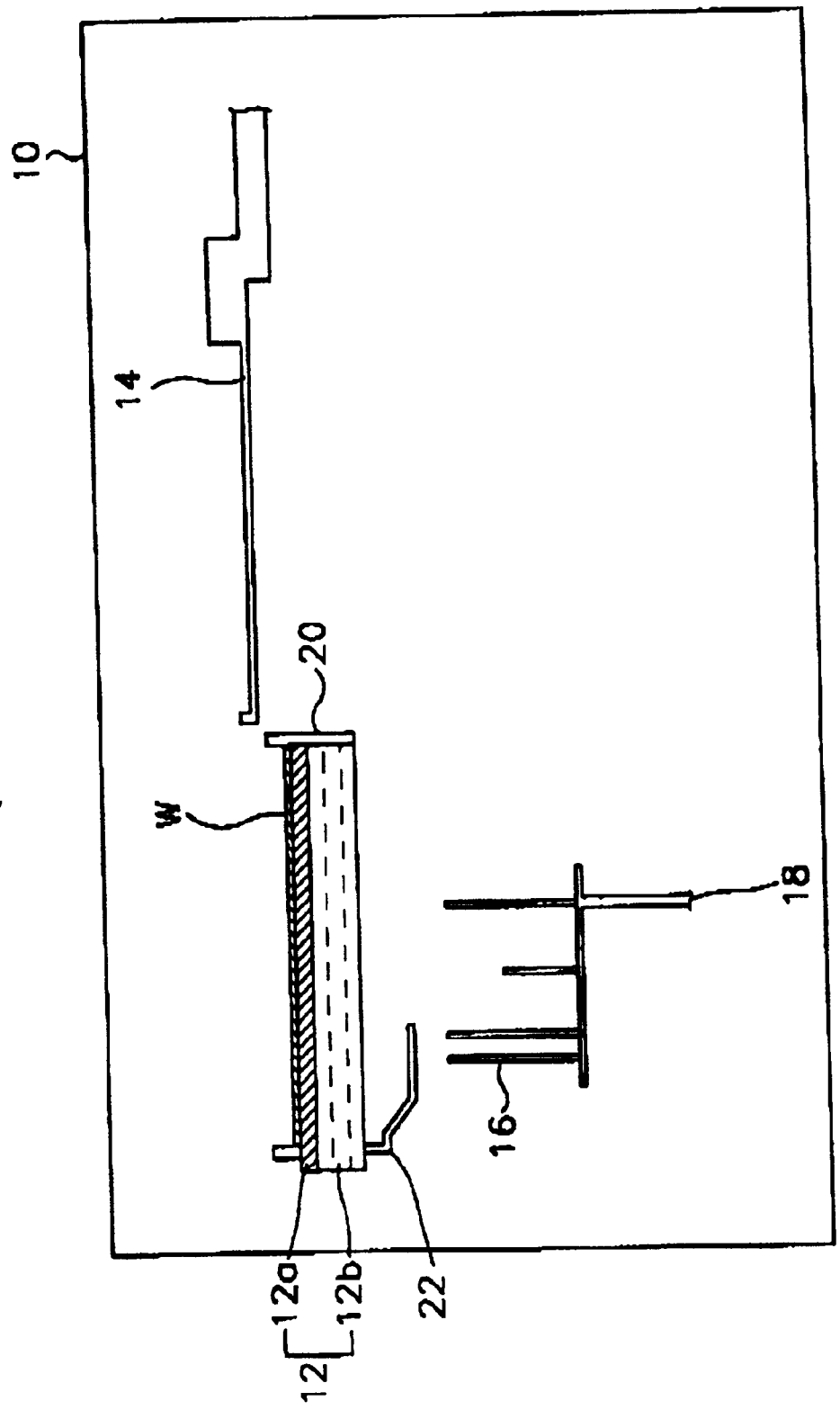
FIG. 1 is a schematic diagram of a conventional processing apparatus.
Figure 2:
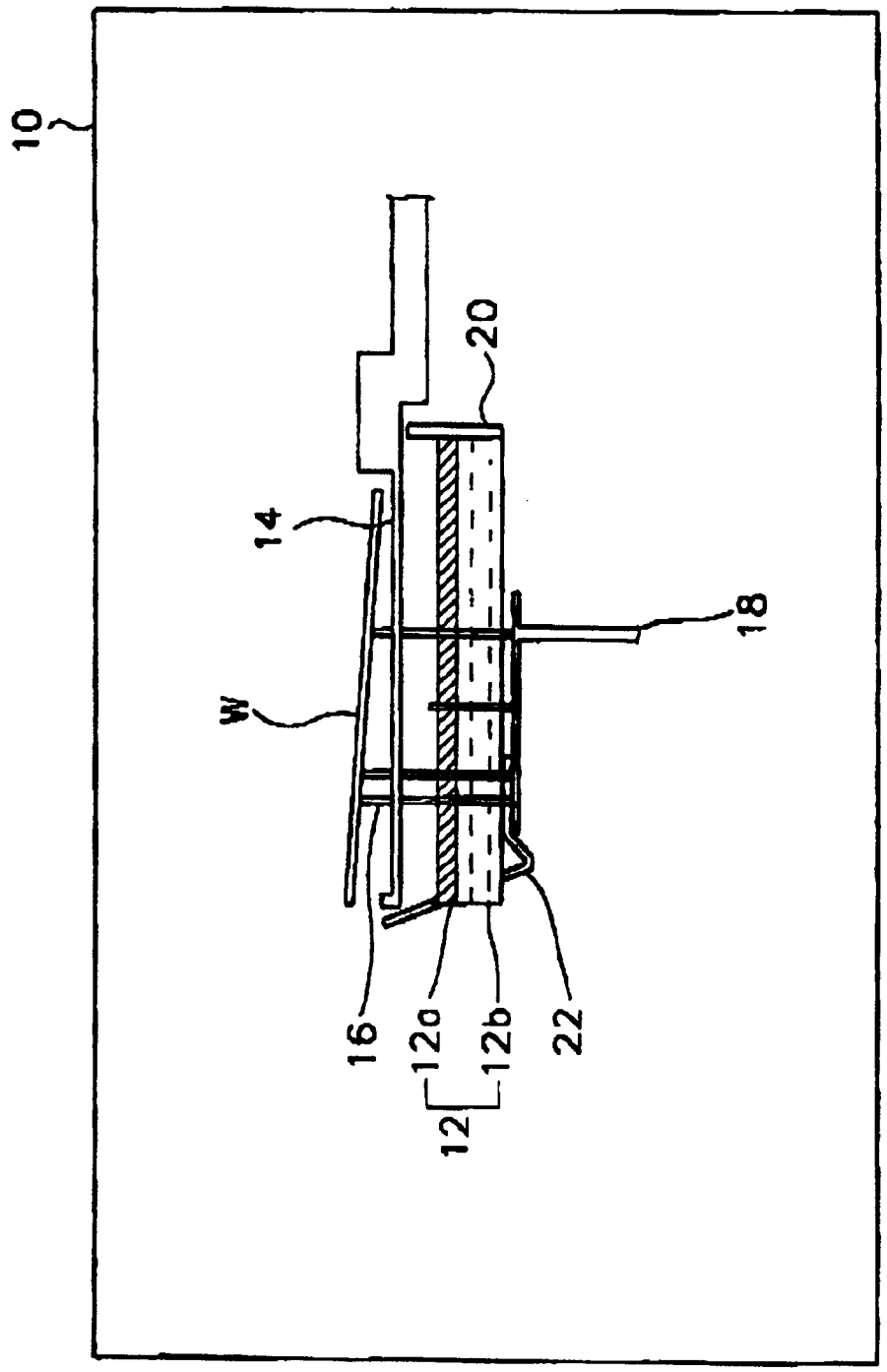
FIG. 2 is a similar diagram, illustrating the carrying of a wafer within the processing chamber.
Figure 3:
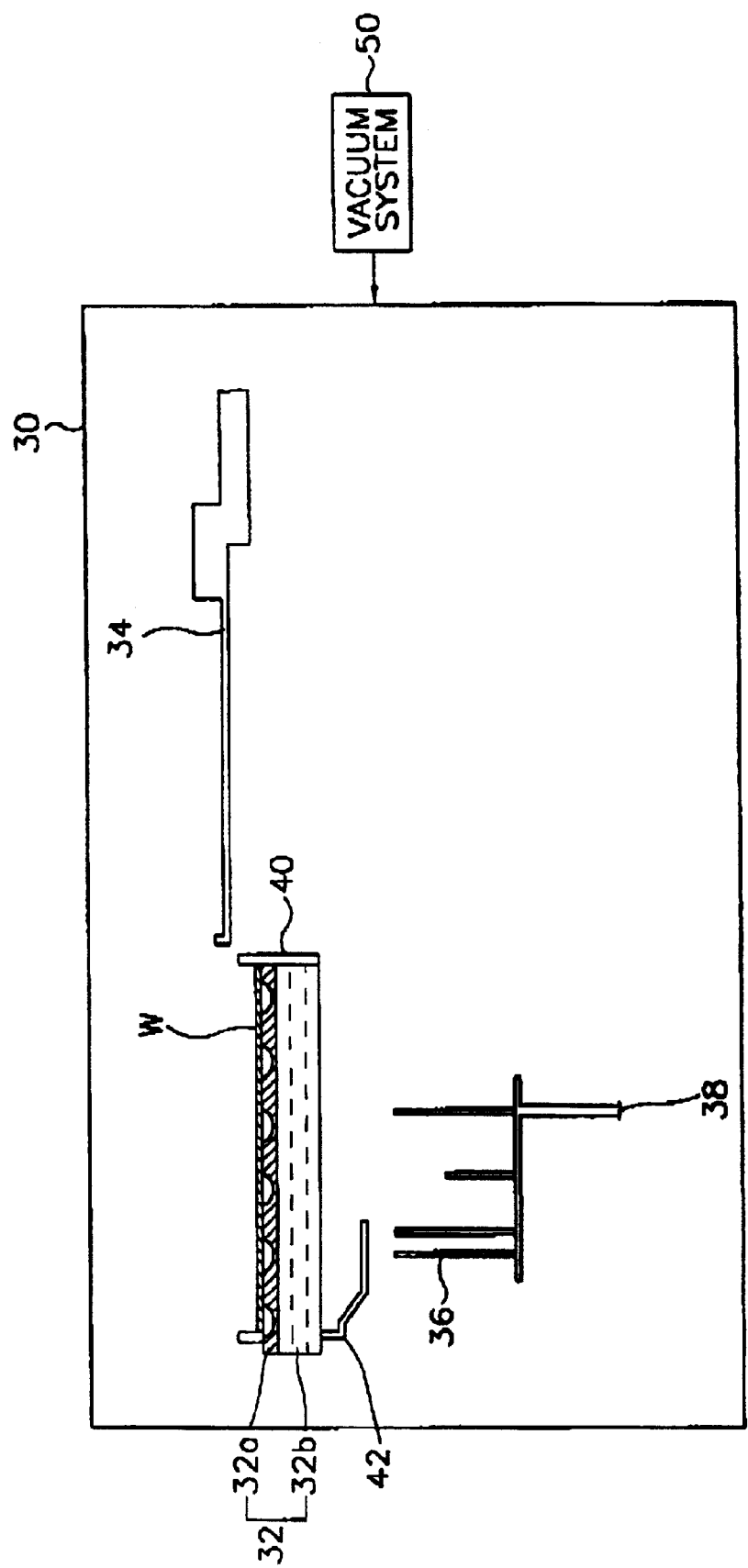
FIG. 3 is a schematic diagram of a processing apparatus according to the present invention.

First, a general processing apparatus having a processing chamber in which a process is performed under a high vacuum atmosphere will be described in detail with reference to FIG. 3.

The processing apparatus includes a processing chamber 30 and a vacuum system 50 comprising a pump for evacuating the chamber 30 to produce a vacuum of $1.0 \times 10^{-6}$ Torr under which a wafer W is processed in the camber 30.

A plate assembly 32, on which the wafer W is placed, is disposed in the processing chamber 30. The plate assembly 32 includes a pad 32a for making face-to-face contact with the wafer W and a plate 32b for supporting the pad 32a when the wafer W is positioned on the plate assembly 32.

Figure 6:
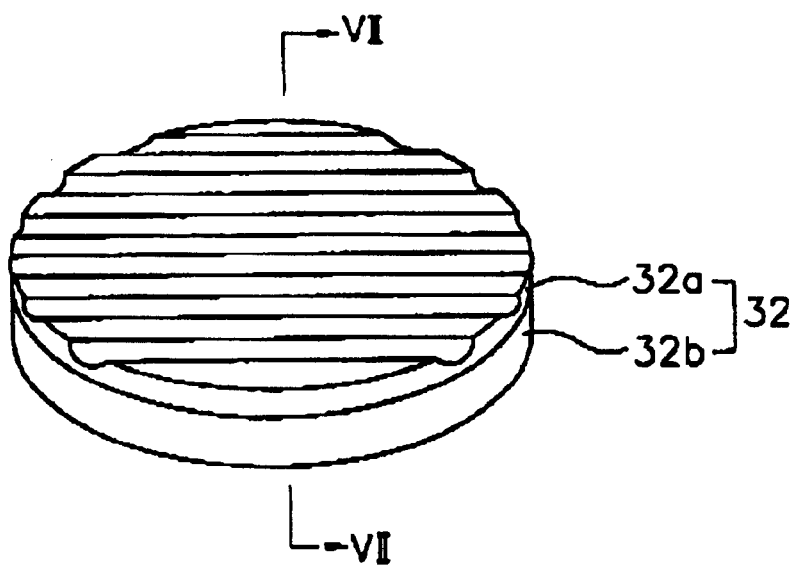
FIG. 6 is a perspective view of a plate assembly of a processing apparatus according to the present invention.
Figure 7:
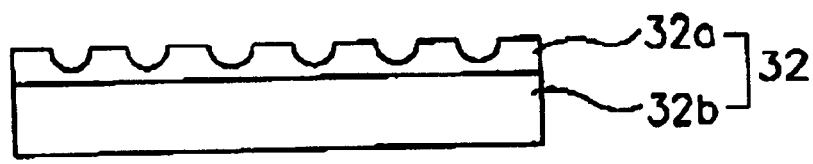
FIG. 7 is a sectional view of the plate assembly, taken along line VII—VII in FIG. 6.

The plate assembly 32 will be described in detail with reference to FIGS. 6 and 7. The pad 32a has a plurality of recesses in the upper exposed surface thereof. The recesses are in the form of grooves that extend continuously from one side of the pad 32a to the other. Moreover, the grooves are straight and have curved cross-sectional profiles so as to form channels in the upper surface of the pad 32a. These channels open at the outer periphery of the upper surface of the pad 32a. Accordingly, the vacuum produced in the processing chamber 30 by the vacuum system 50 can act through the recesses of the pad 32a on the rear surface of a wafer W that has been placed on the plate assembly 32.

Still further, the plate assembly 32 has an overall shape that is determined by the shape of the workpiece that is to be positioned on the plate assembly 32. In the case of the wafer W shown in connection with the embodiment of FIG. 3, the plate assembly 32 is generally disc-shaped. In addition, the plate assembly 32 has a larger diameter than the wafer W has. Accordingly, the plate assembly 32 supports the wafer W in a state in which the entire rear surface of the wafer W overlies the pad 32a.

Meanwhile, the pad 32a is made of a material that does not affect the process to be carried out on the wafer W. For this reason, the pad 32a is made from a non-ferrous material. Preferably, the material of the pad may comprise a rubbery material. A silicon component may be added to the material of the pad 32a.

Referring again to FIG. 3, the processing apparatus also includes a robot arm 34. The wafer W can be carried by the robot arm 34 from outside of the processing chamber 30 onto the plate assembly 32 or, vice versa, from the plate assembly 32 to the outside of the processing chamber 30.

Moreover, the processing apparatus includes a lifter (elevator) 38 and lifter pins 36. The lifter 38 is vertically movable in the apparatus and is connected to the lifter pins 36 to move the lifter pins 36 upwardly and downwardly Note, the plate assembly 32 has openings therethrough that allow the lifter pins 36 to extend through the plate assembly 32. Therefore, the lifter pins 36 can move upward and downward along pathways defined by the openings of the plate assembly 32. Accordingly, the lifter pins 36 and the lifter 38 can receive the wafer W carried into the processing chamber 30 by the robot arm 34 and then place the wafer W on the plate assembly 32. Alternatively, the lifter pins 36 and the lifter 38 can lift the wafer W from the plate assembly 32 so that the robot arm 34 can receive the wafer W and carry the wafer W to the outside of the processing chamber 30.

Figure 8:
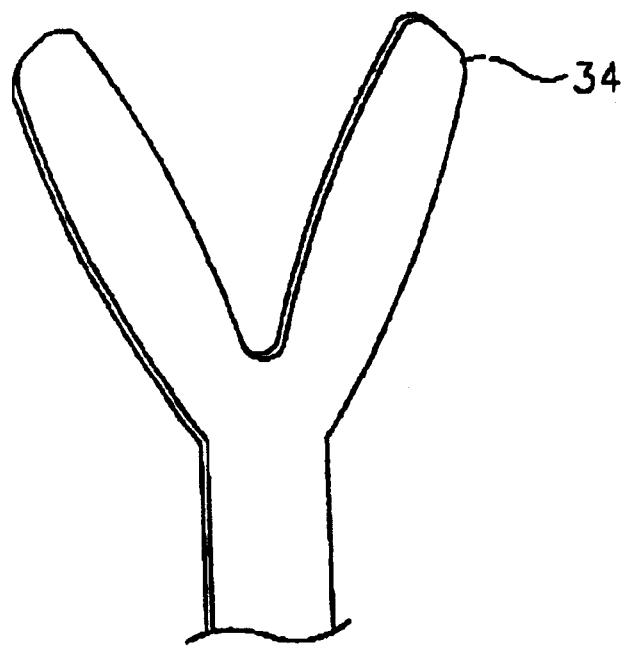
FIG. 8 is a plan view of a robot arm of the processing apparatus shown in FIG. 3.

As shown in FIG. 8, the robot arm 34 is has a bifurcated, e.g., Y-shaped, end that supports the rear surface of the wafer W while the wafer W is being transported. Thus, the robot arm 34 does not interfere with the operation of the lifter pins 36. That is, the lifter pins 36 are arranged so as to fit between the branches of the bifurcated end of the robot arm 34.

Typically, at least two lifter pins 36 are provided to support the wafer W so that the wafer W will be well-balanced.

Referring once again back to FIG. 3, the plate assembly 32 may also include a flange 42 and a fence 40. The flange 42 is pivotally mounted at an intermediate portion thereof in the plate assembly 32. The flange 42 also extends upwardly a predetermined distance from the edge of the pad 32a, at a first end thereof, and extends at the second end thereof from the peripheral edge of the plate 32b toward the center of the plate assembly 32. The fence 40 extends along a peripheral portion of the pad 32a opposite the peripheral portion of the plate assembly 32 to which the flange 42 is mounted. The fence 40 supports the wafer W guided by the flange 42. Therefore, the flange 42 and the fence 40 function to position the wafer relative to the pad 32a.

Figure 9:
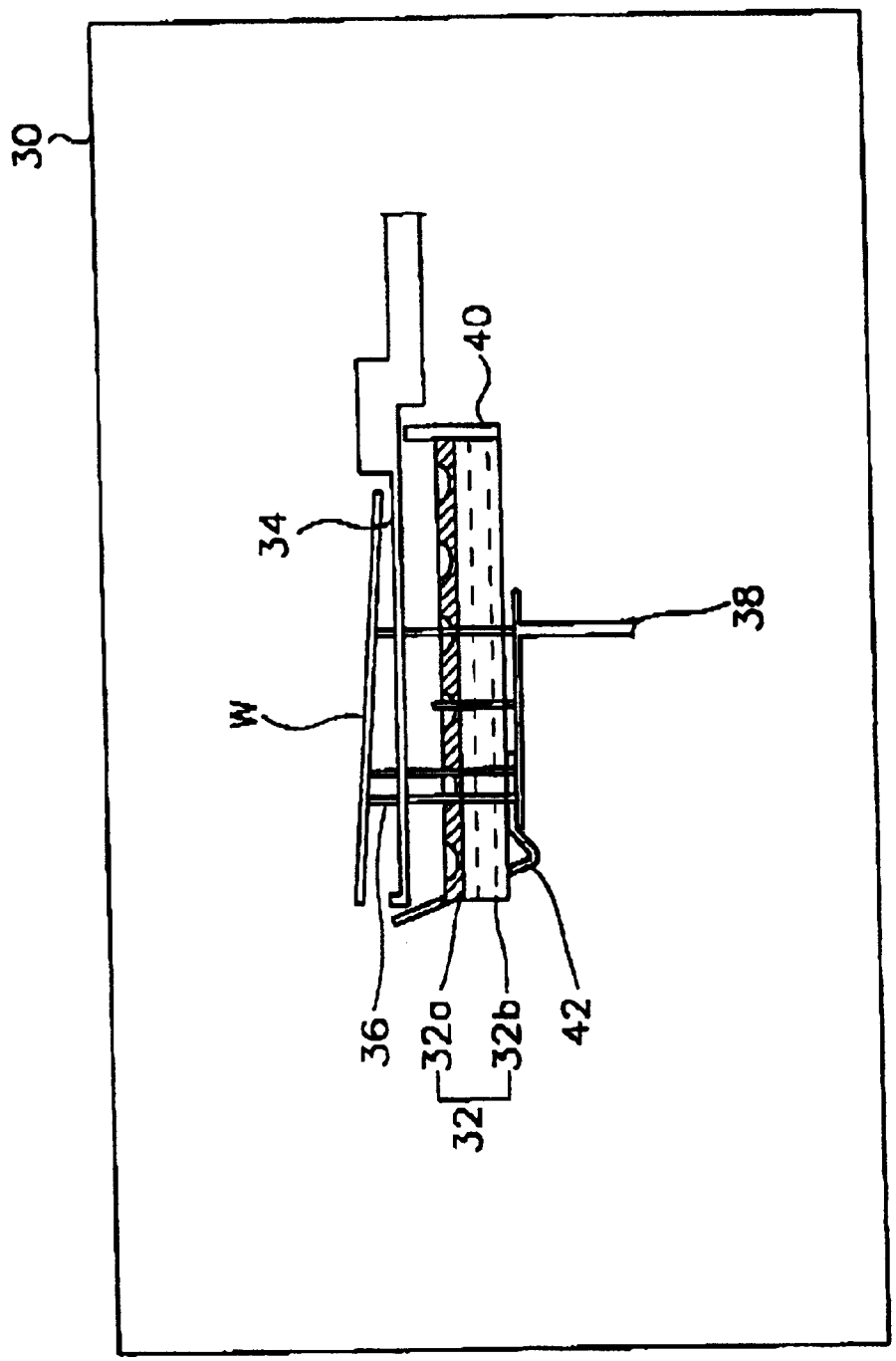
FIG. 9 is schematic diagram of the processing apparatus according to the present invention, illustrating the lifting of the wafer from the plate assembly thereof.

As can be best appreciated from the illustration of FIG. 9. the wafer W is placed on the pad 32a of the plate assembly 32 as follows.

First, the robot arm 34 carries the wafer W from the outside of the processing chamber 30 to a position over the plate assembly 32. Then, the lifter 38 raises the lifter pins 36 into a space between the branches of the bifurcated end of the robot arm 34. Accordingly, the lifter pins 36 contact the bottom surface of the wafer W. As the lifter pins 36 are lifted further up, the flange 42 is pressed by the lifter 38 so that the flange 42 is rotated in a counterclockwise direction. At this time, as the wafer W is held by the lifter pins 36, the robot arm 34 is pulled back in a direction away from the plate assembly 32. Then, the lifter 38 lowers the lifter pins 36. Accordingly, the wafer W is placed on the plate assembly 32. At the same time, the flange 42 is pivoted clockwise towards its original position to push the wafer W towards the fence 40. The wafer W is stopped up against the fence 40. That is, the wafer W is placed on the plate assembly 32 by the lifter 38 and the lifter pins 36 and is positioned precisely on the pad 32a by the flange 42 and the fence 40. Although these members are sufficient to precisely position the wafer on the pad 32a, other wafer-positioning members may be provided as an alternative to or in addition to the flange 42 and fence 40.

The processing of the wafer W in the manufacturing of a semiconductor device is then carried out. At this time, the high vacuum atmosphere in the processing chamber 30 is applied to the rear surface of the wafer W through the recesses formed in the pad 32a of the plate assembly 32.

Hereinafter, the method of carrying the wafer W to the outside of the processing chamber 30 after the process is completed in the high vacuum atmosphere will be described, again, with reference to FIG. 9.

First, the lifter 38 is operated to lift the lifter pins 36 at a constant speed. Thus, the wafer W is raised from the plate assembly 32 by the lifter pins. In the prior art, a pressure difference exists between the vacuum in the processing chamber 30 and the space between the wafer W and the plate assembly 32. Such a pressure difference can cause the wafer to be placed incorrectly on the robot arm 34 by the lifter pins 36. A mis-positioned wafer W might be damaged while being transported by the robot arm 34 in such. In the present embodiment, however, the vacuum is allowed to act on the rear surface of the wafer W through the recesses of the pad 32a. Therefore, the pressure difference with respect to both sides of the wafer W is minimized by the vacuum acting on the rear surface of the wafer W. As a result, any tendency for the wafer W to be mis-positioned is minimized.

Next, the lifter 38 is operated to lower the lifter pins 36. Accordingly, the wafer W is positioned with precision on the robot arm 34 by the lifter pins 36. The wafer W is, in turn, carried by the robot arm 34 to the outside of the processing chamber 30 while the wafer W is seated correctly on the robot arm 34. Therefore, the wafer W will not be scratched by the robot arm 34 or dropped by the robot arm 34.

Next, an ion-implantation apparatus to which the present invention applies will be described with reference to FIG. 4.

Figure 4:
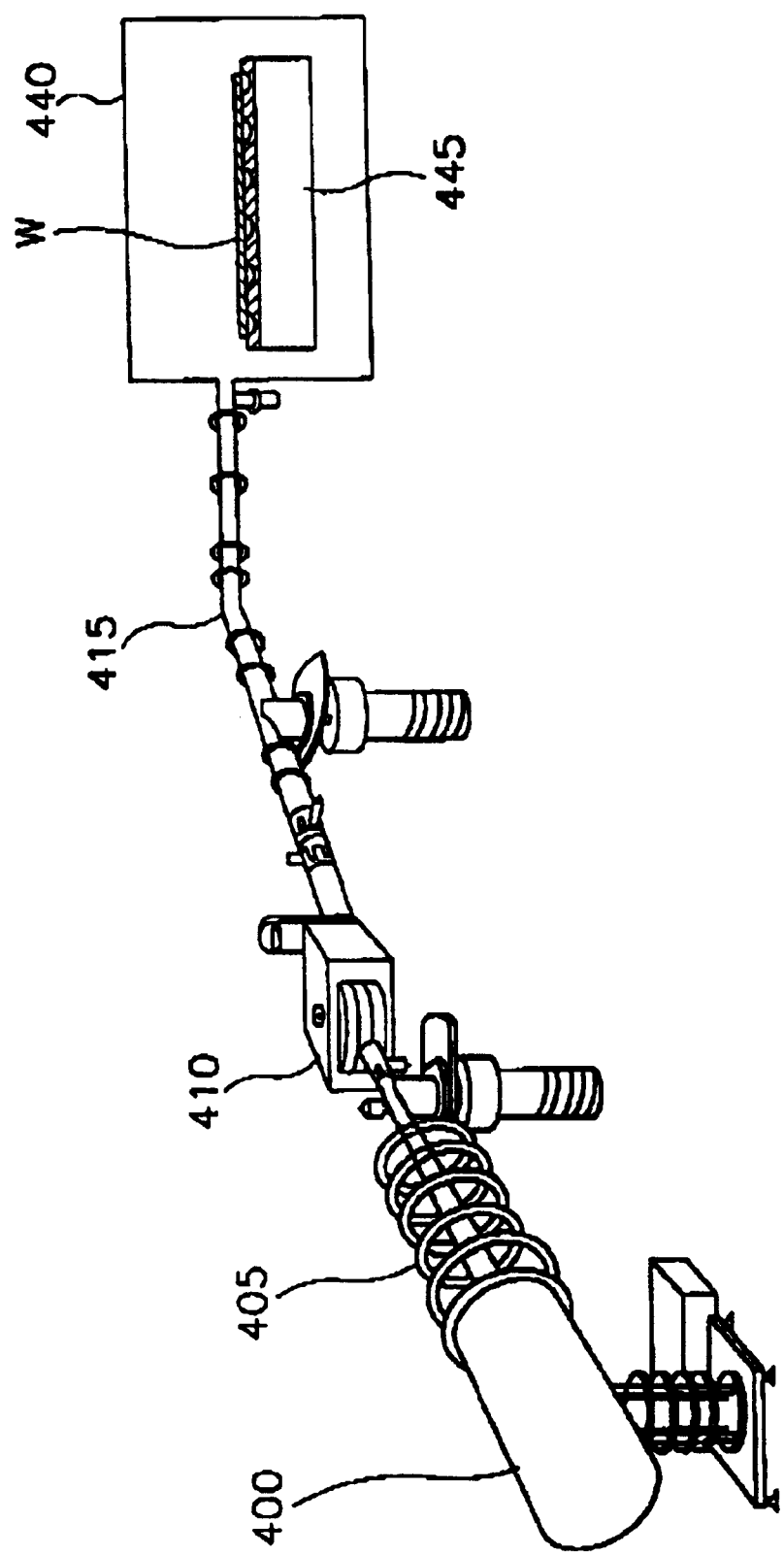
FIG. 4 is a schematic diagram of an embodiment of an ion-implantation apparatus according to the present invention.

FIG. 4, shows a high-energy ion implanter. The ion implanter includes an ion source 400 for extracting ions, an ion accelerator 405 for accelerating the extracted ions, a mass analyzer 410 for selecting, from among the extracted ions, the desired ions to be implanted into the wafer W, and a deflector 415 for providing the desired ions with directivity in order to uniformly distribute the ions to the wafer W.

Furthermore, the processing apparatus includes a processing chamber 440 in which the wafer W is positioned. A plate assembly 445, of the type described above according to the present invention, is disposed in the processing chamber 440 to support a wafer W during the ion-implantation process. The vacuum in the processing chamber 440 is no more than $1.0 \times 10^{-3}$ Torr to $1.0 \times 10^{-6}$ Torr.

Next, a film forming apparatus to which the present invention applies will be described with reference to FIG., 5.

Figure 5:
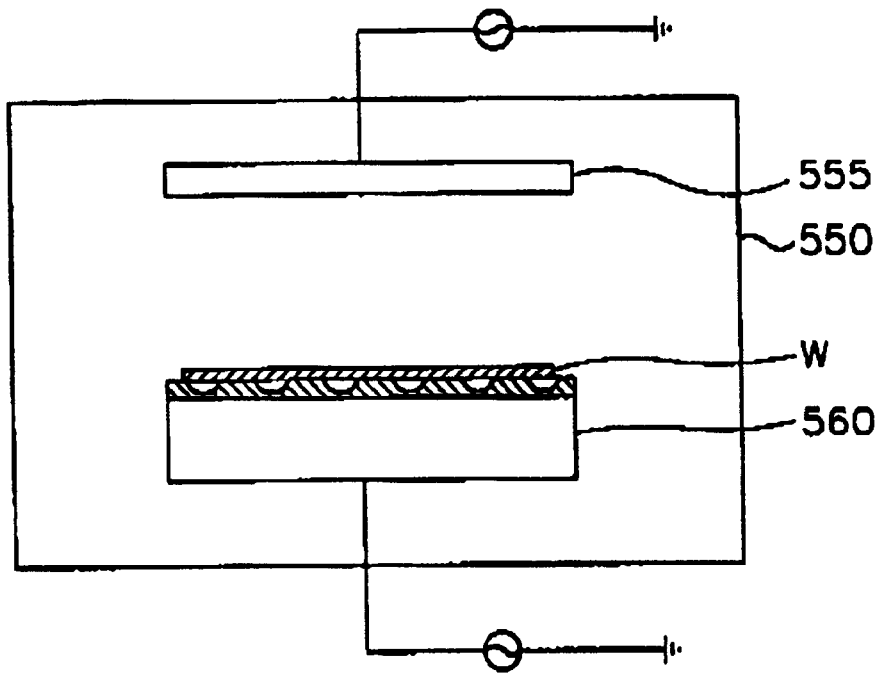
FIG. 5 is a schematic diagram of an embodiment of a film forming apparatus according to the present invention.

In particular, FIG. 5 shows an apparatus for forming a film on the wafer W by CVD (chemical vacuum deposition). The CVD process is accomplished in a processing chamber 550 using plasma. Therefore, the film forming apparatus is provided with electrodes 555 and 560 for supplying electrical energy to generate the plasma. The film forming apparatus includes a plate assembly 560, of the type described above according to the present invention, for supporting the wafer W while a film is formed thereon. In this case, the plate assembly 560 is used as one of the electrodes. During CVD, a pressure of no more than $1.0 \times 10^{-3}$ Torr to $1.0 \times 10^{-6}$ Torr is established in the processing chamber 550.

Although the apparatus for forming a film on the wafer has been described above in connection with CVD, the present invention may also be applied to other film forming processes such as sputtering. Also. The present invention may be applied to apparatus for patterning a layer of material on a wafer and the like.

According to the present invention as described above, in a processing chamber having a high vacuum atmosphere, the supported bottom surface of a wafer or other type of workpiece is exposed to the high vacuum atmosphere. Therefore, a pressure difference hardly exists with respect to both sides of the wafer. Accordingly, the wafer can be transferred from the wafer support while its relative position is precisely maintained. Therefore, the wafer can be transported while stable so as not to be damaged. Accordingly, the reliability and the productivity of the processes for manufacturing the semiconductor device are improved by the present invention.

Finally, although the present invention has been described in detail above with respect to the preferred embodiments thereof, the present invention is not limited to these preferred embodiments. Rather, various changes and modifications can be made to the disclosed invention within the true spirit and scope thereof as defined by the appended claims.

What is claimed is:

1. A plate assembly for use in supporting a workpiece in a processing chamber while the workpiece is being processes in a vacuum, said plate assembly comprising:

an underlying plate, and a pad that is disposed on said plate for use in supporting the workpiece, said pad being of a rubbery material and having an upper surface remote from said plate, and said pad having a plurality of parallel grooves extending in the upper surface thereof, said grooves extending depthwise less than completely through the pad and extending lengthwise all the way across said pad from one side of said upper surface of the pad to the other, whereby the vacuum in the processing chamber can act through said grooves on the rear surface of a workpiece that is resting on the upper surface of the pad.

2. A plate assembly according to claim 1, wherein said plate and said pad together have the shape of a disc.

3. A plate assembly according to claim 1, and further comprising support members extending upwardly from the upper surface of said pad at the periphery thereof for use in positioning the workpiece on the pad.

4. A plate assembly according to claim 3, wherein said support members comprise a flange and a fence, said flange having a first end protruding upwardly from the upper surface of said pad at one side thereof, a second end extending beneath said plate from the outer periphery toward the center of said plate, and an intermediate portion at which the flange is pivotally supported, and said fence extending along the periphery of the upper surface of said pad at a location diametrically across from the first end of said flange.

5. A processing apparatus including:

a processing chamber;

a vacuum system connected to said processing chamber so as to evacuate said chamber and thereby produce a vacuum atmosphere in said processing chamber;

a plate assembly disposed in said processing chamber for supporting a workpiece as the workpiece is being processed, said plate assembly including a plate, and a pad that is disposed on said plate, said pad being of a rubbery material and having an upper surface remote from said plate, and said pad having a plurality of parallel grooves extending in the upper surface thereof, said grooves extending depthwise less than completely through the pad and extending lengthwise all the way across said pad from one side of said upper surface of the pad to the other, whereby the vacuum in the processing chamber can act through grooves on the rear surface of a workpiece that is resting on the upper surface of the pad;

a lifter disposed in said processing chamber below said plate assembly, said lifter being movable vertically in said processing chamber; and at least one lift pin extending vertically from said lifter and movable into and out of contact with the rear surface of a workpiece resting on said pad to selectively raise and lower the workpiece from and on to said pad.

6. A processing apparatus according to claim 5, wherein said plate assembly includes a flange and a fence, said flange having a first end protruding upwardly from the upper surface of said pad at one side thereof, an intermediate portion at which the flange is pivotally supported, and a second end extending beneath said plate in the path of said lifter such that the first end of said flange moves horizontally in accordance with upward and downward movements of said lifter to guide a workpiece onto said pad, and said extending along the periphery of the upper surface of said pad at a location diametrically across from the first end of said flange to support the workpiece as the workpiece is guided onto said pad by the flange.

7. A processing apparatus according to claim 5, and further comprising a robot arm having a working range by which the robot arm can carry the workpiece from outside of the processing chamber to the vicinity of the plate assembly and from the vicinity of the plate assembly to the outside of the processing chamber.

8. A processing apparatus according to claim 7, wherein the robot arm has a bifurcated free end.

9. A processing apparatus according to claim 5, wherein said vacuum system is operative to produce a vacuum in the processing chamber of less than $1.0 \times 10^{-3}$ Torr.

10. A processing apparatus according to claim 5, wherein said plate and said pad together have the shape of a disc.

11. A processing apparatus according to claim 5, wherein the processing apparatus has at least two of said lifter pins.

12. A processing apparatus according to claim 5, and further comprising an upper electrode disposed above said plate assembly in the processing chamber, and an electrical power source connected to said upper electrode and to said plate assembly.

13. A processing apparatus according to claim 5, and further comprising an ion source connected to said processing chamber.

* * * * *